United States Patent
Cao et al.

(10) Patent No.: US 6,872,668 B1
(45) Date of Patent: Mar. 29, 2005

(54) MULTI-STEP TUNGSTEN ETCHBACK PROCESS TO PRESERVE BARRIER INTEGRITY IN AN INTEGRATED CIRCUIT STRUCTURE

(75) Inventors: Wanqing Cao, Portland, OR (US); Guo-Qiang Lo, Portland, OR (US); Shih-Ked Lee, Hillsboro, OR (US); Hongyong Xue, Portland, OR (US)

(73) Assignee: Integrated Device Technology, Inc., Santa Clara, CA (US)

( * ) Notice: Subject to any disclaimer, the term of this patent is extended or adjusted under 35 U.S.C. 154(b) by 658 days.

(21) Appl. No.: 09/671,667

(22) Filed: Sep. 26, 2000

(51) Int. Cl.[7] ............................................. H01L 21/302
(52) U.S. Cl. ..................... 438/706; 438/710; 438/712; 438/720
(58) Field of Search .............................. 438/706, 710, 438/712, 720, 666, 637, 643, 648, 629

(56) References Cited

U.S. PATENT DOCUMENTS

| | | | | |
|---|---|---|---|---|
| 5,552,016 A | * | 9/1996 | Ghanayem | 156/345 |
| 5,786,272 A | * | 7/1998 | Marangon et al. | 438/628 |
| 5,798,303 A | * | 8/1998 | Clampitt | 438/696 |
| 5,804,502 A | | 9/1998 | Gabriel et al. | |
| 5,915,202 A | * | 6/1999 | Lo et al. | 438/666 |
| 6,325,861 B1 | * | 12/2001 | Stinnett | 134/2 |

* cited by examiner

Primary Examiner—Benjamin L. Utech
Assistant Examiner—Lan Vinh
(74) Attorney, Agent, or Firm—Bever, Hoffman & Harms, LLP

(57) ABSTRACT

An improved method is provided for etching back a tungsten layer that overlies a titanium nitride adhesion layer on a semiconductor structure. This method includes the steps of: (1) performing a first plasma etchback of the tungsten layer for a first predetermined time period, such that a thin layer of tungsten remains over the adhesion layer at the end of the first plasma etchback, (2) actively or passively cooling the resulting semiconductor structure to a temperature of 35° C. or lower, and then (3) performing a second plasma etchback of the tungsten layer until an endpoint is detected, thereby exposing the adhesion layer. Cooling the semiconductor structure prior to the second plasma etchback ensures that the titanium nitride adhesion layer is at a relatively low temperature during the second plasma etchback. The titanium nitride adhesion layer etches significantly slower at lower temperatures, thereby making it easier to stop the second plasma etchback on the adhesion layer.

21 Claims, 5 Drawing Sheets

MULTI-STEP TUNGSTEN ETCHBACK PROCESS TO PRESERVE BARRIER INTEGRITY IN AN INTEGRATED CIRCUIT STRUCTURE

BACKGROUND OF THE INVENTION

1. Field of the Invention

The present invention relates to a semiconductor process for fabricating integrated circuit devices. More specifically, the present invention relates to a process used to form a tungsten plug in a contact opening or via.

2. Discussion of Related Art

Tungsten (W) plugs are commonly used to provide contact to the upper surfaces to active regions of circuits formed in a semiconductor wafer. To help the tungsten adhere to the semiconductor surface, an adhesion layer, such as titanium nitride (TiN) is commonly deposited before the tungsten. The adhesion layer readily adheres to the semiconductor surface, and provides a layer to which the tungsten will readily adhere.

FIG. 1A is a cross-sectional view of a conventional semiconductor structure 100 that includes semiconductor substrate (wafer) 10, source region 20, drain region 21, gate structure 22 and field oxide layer 23. Regions 20A and 21A are contact regions where contact is to be made to source 20 and drain 21, respectively, of the MOS transistor. Dielectric layer 24 is formed over the upper surface of the MOS transistor structure. Contact openings 25 are formed through dielectric layer 24 to expose contact regions 20A and 21A. An adhesion layer 31, which includes a layer of TiN, is formed over the resulting structure, and extends into openings 25. A tungsten (W) contact layer 32 is formed over adhesion layer 31, and also extends into openings 25.

Tungsten layer 32 is etched back using a blanket plasma etch process. It is desirable for this plasma etch process to stop on adhesion layer 31, thereby forming tungsten plugs 32P (FIG. 1B). However, if the plasma etch inadvertently removes a portion of adhesion layer 31, then the plasma etch will rapidly remove the underlying portion of dielectric layer 24 (and field oxide layer 23, if present under the opening in adhesion layer 31).

FIG. 1B illustrates an opening 41, which is inadvertently formed through adhesion layer 31 during the plasma etch. Opening 41 extends through adhesion layer 31 into the underlying dielectric layer 24. Note that the plasma etch also forms tungsten plugs 32P from tungsten layer 32.

As shown in FIG. 1C, a first conductive layer 51, such as aluminum, is subsequently deposited over the upper surface of the resulting structure. First conductive layer 51 contacts tungsten plugs 32P. A portion 51A of first conductive layer 51 fills opening 41.

As shown in FIG. 1D, a patterned mask 61 is formed over the upper surface of first conductive layer 51. Mask 61 includes an opening 62, which exposes a portion of the first metal layer to be etched. An etch is performed through opening 62, with the intent of etching entirely through first conductive layer 51, thereby forming two separate conductive traces. However, it is difficult for the etch to entirely remove aluminum portion 51A from opening 41. As a result, part of aluminum portion 51A may remain in opening 41 at the end of the etch. As illustrated in FIG. 1D, any remaining part of aluminum portion 51A may provide an undesirable short between the intended separate conductive traces.

One method of preventing etch-through of the adhesion layer is described in U.S. Pat. No. 5,804,502 to Gabriel et al., which suggests providing a thicker adhesion layer near the edges of the semiconductor structure. While etching the tungsten layer, the semiconductor structure of Gabriel et al. becomes hotter near the edges than at the center. The higher temperature at the edges results in faster etching of the tungsten and adhesion layers near the edges. Gabriel et al. therefore provides an adhesion layer that is thicker near the edges, thereby preventing all of the adhesion layer from being removed at the edges of the wafer.

Another method for improving the etching of a tungsten layer and an adhesion layer is described in U.S. Pat. No. 5,915,202 to Lo et al., which suggests performing a two-step etchback process. In the two-step etchback process of Lo et al., the first etch takes place in a first RF plasma in a first flowing gas mixture of oxygen, argon and $SF_6$, and the second etch takes place in a second flowing gas mixture of oxygen and an inert gas. Lo et al. teaches that it is critical to sustain uninterrupted RF power between the first and second steps (preventing the substrate from cooling) in order to reduce etch byproduct redeposition onto the plasma chamber walls and other plasma etch apparatus features.

It would therefore be desirable to have a method for performing an etchback of a tungsten layer that overlies an adhesion layer, without etching through the adhesion layer, thereby avoiding the above-described problems.

SUMMARY

Accordingly, the present invention provides an improved method of etching back a tungsten layer that overlies a titanium nitride adhesion layer on a semiconductor structure, the method including the steps of: (1) performing a first plasma etchback of the tungsten layer, such that a thin layer of tungsten remains over the adhesion layer at the end of the first plasma etchback, (2) actively or passively cooling the resulting structure after the first plasma etchback, and then (3) performing a second plasma etchback of the tungsten layer, thereby exposing the adhesion layer. In a particular embodiment, the structure is cooled to a temperature of 35° C. or less. Cooling the structure prior to the second plasma etchback ensures that the titanium nitride adhesion layer is at a relatively cool temperature during the second plasma etchback. The titanium nitride adhesion layer etches significantly slower at cooler temperatures, thereby making it easier to stop the second plasma etchback on the adhesion layer. In one embodiment, the first plasma etchback is performed for a predetermined time period and the second plasma etchback is performed until an optical emission system detects an endpoint.

In another embodiment of the present invention, the method includes the steps of (1) performing a plasma etchback of the tungsten layer, (2) actively or passively cooling the resulting structure to a temperature of 35° C. or lower, and then (3) repeating steps (1) and (2) until the adhesion layer is exposed.

The present invention will be more fully understood in view of the following description and drawings.

DETAILED DESCRIPTION

Figure 1A:
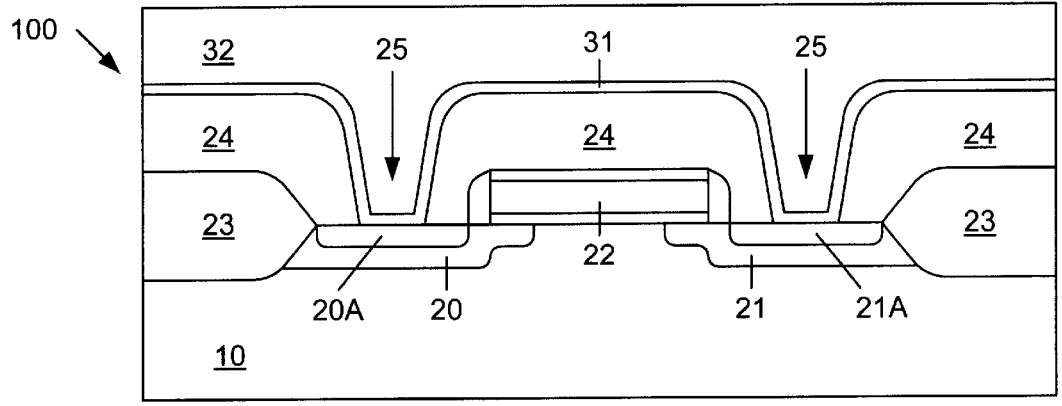
FIGS. 1A–1D are cross sectional views of a conventional semiconductor structure during various stages of fabrication.
Figure 1B:
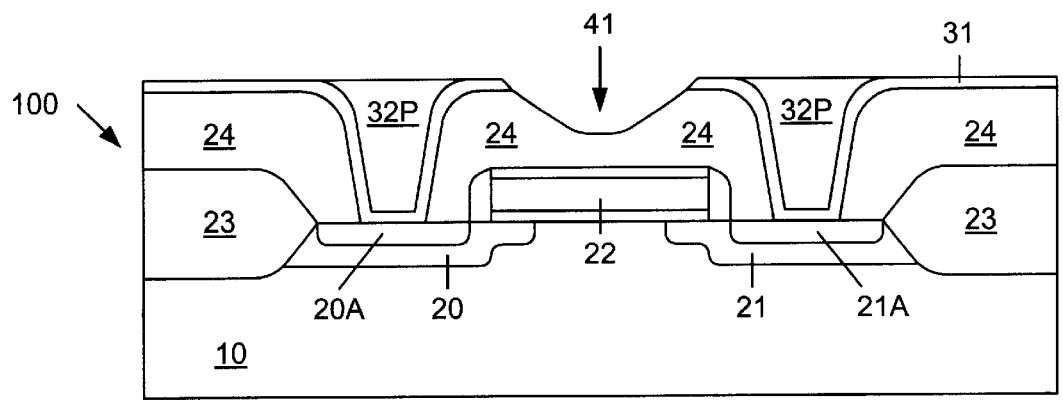
Figure 1C:
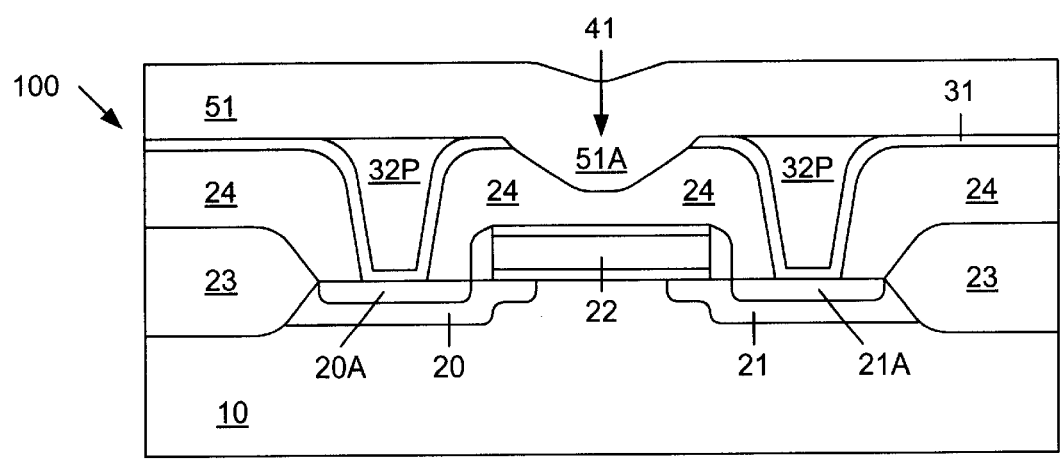
Figure 1D:
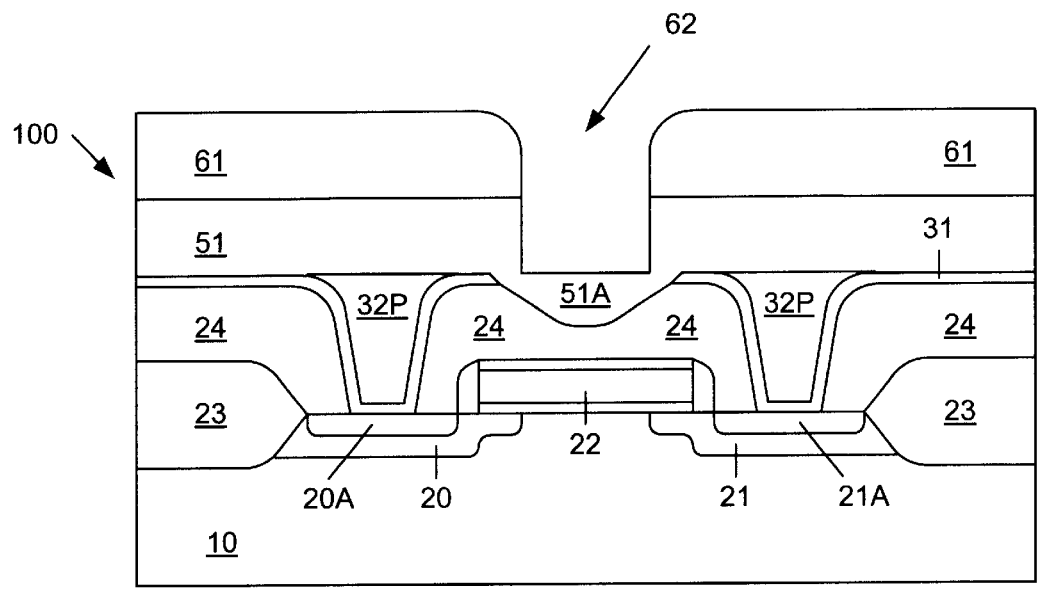
Figure 2:
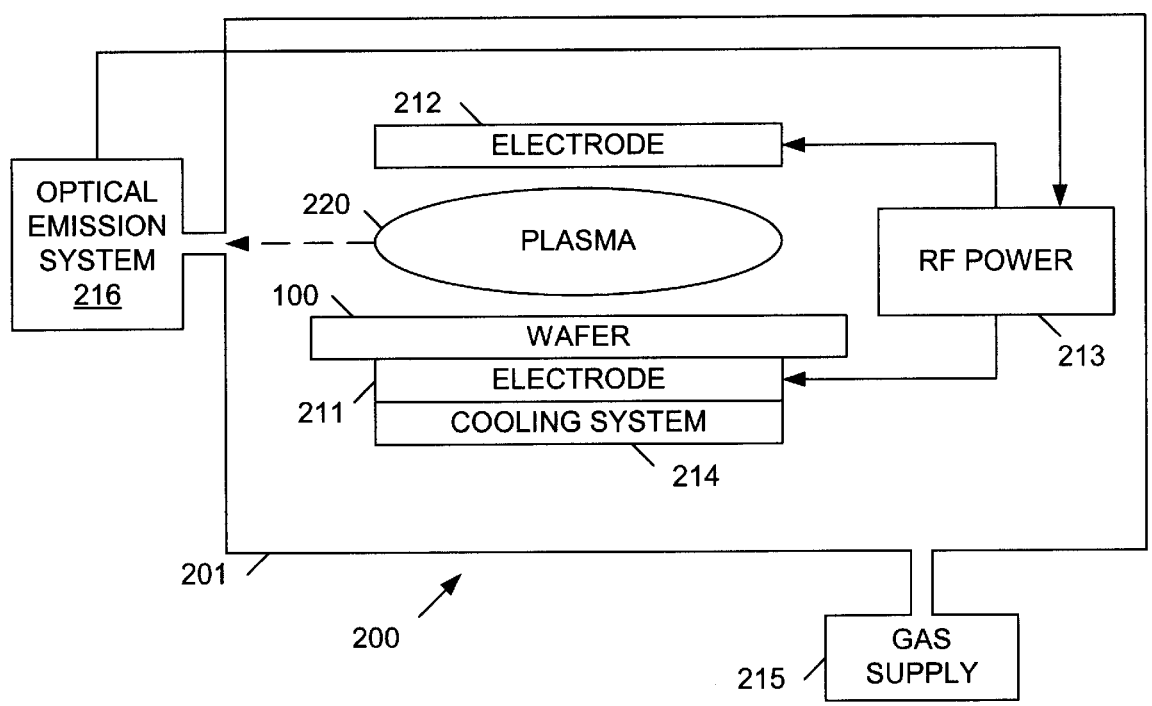
FIG. 2 is a block diagram of a semiconductor processing system that is used in accordance with one embodiment of the present invention.

FIG. 2 is a block diagram of a semiconductor processing system 200 which is used to process the semiconductor structure 100 (FIG. 1A) in accordance with one embodiment of the present invention. System 200 includes a plasma chamber 201 which houses electrodes 211 and 212, a radio frequency (RF) power source 213, a helium cooling system 214, a gas supply system 215 and an optical emission system 216. A system including the elements of semiconductor processing system 200 can be purchased from Applied Materials.

Semiconductor structure 100 is electrostatically mounted on electrode/chuck 211. Electrode 212 is separated from electrode 211 and structure 100, with RF power source 213 providing power to electrodes 211–212. Gas supply system 215 is configured to introduce one or more gases into chamber 201. In a manner known in the art, the RF power applied to electrodes 211–212, combined with the gases introduced by gas supply system 215, results in the formation of a plasma 220 between electrodes 211 and 212. In general, plasma 220 removes (etches) material from the exposed upper surface of semiconductor structure 100. The power introduced by RF power supply 213 results in high temperatures within chamber 201. Helium cooling system 214 is therefore provided to cool semiconductor structure 100.

In the described embodiment, dielectric layer 24 of semiconductor structure 100 is borophosphosilicate glass (BPSG) having a thickness in the range of 300 to 800 nm. In a particular embodiment, dielectric layer 24 has a thickness of about 450 nm. In other embodiments, dielectric layer 24 can be formed of other materials, such as silicon oxide or spin-on-glass (SOG).

In the described embodiment, adhesion layer 31 is TiN having a thickness in the range of 20 to 50 nm. In a particular embodiment, TiN layer 31 has a thickness of about 30 nm. Adhesion layer 31 can be sputtered by applying a DC power of 6500 W to a titanium target in a gas mixture of 80 sccm nitrogen and 40 sccm argon. In other embodiments, adhesion layer 31 can be chemical vapor deposited (CVD) TiN.

In the described embodiment, tungsten layer 32 has a thickness in the range of 400 to 800 nm. In a particular embodiment, tungsten layer 32 has a thickness of about 650 nm. Tungsten layer 32 can be deposited by hydrogen reduction of tungsten hexafluoride, diluted by argon and nitrogen, at an elevated temperature of 400° C. or higher.

An etchback process in accordance with one embodiment of the present invention is performed as follows. Gas supply system 215 is controlled to introduce argon (70 sccm Ar) and sulfur hexafluoride (200 sccm $SF_6$) into chamber 201, and to introduce a pressure of about 200 milli-Torr into chamber 201. RF power supply 213 is controlled to provide RF power in the range of 100 to 1000 W, and preferably about 750 W across electrodes 211 and 212. At this time, gas plasma 220 is formed between electrodes 211 and 212. Plasma 220 etches back tungsten layer 32 in a uniform manner. Helium cooling system 214 is enabled during the entire process, thereby cooling semiconductor structure 100. Helium cooling system 214 maintains electrode 211 at a constant temperature. However, the actual temperature of semiconductor structure 100 rises slowly over time during the plasma etch.

Figure 3:
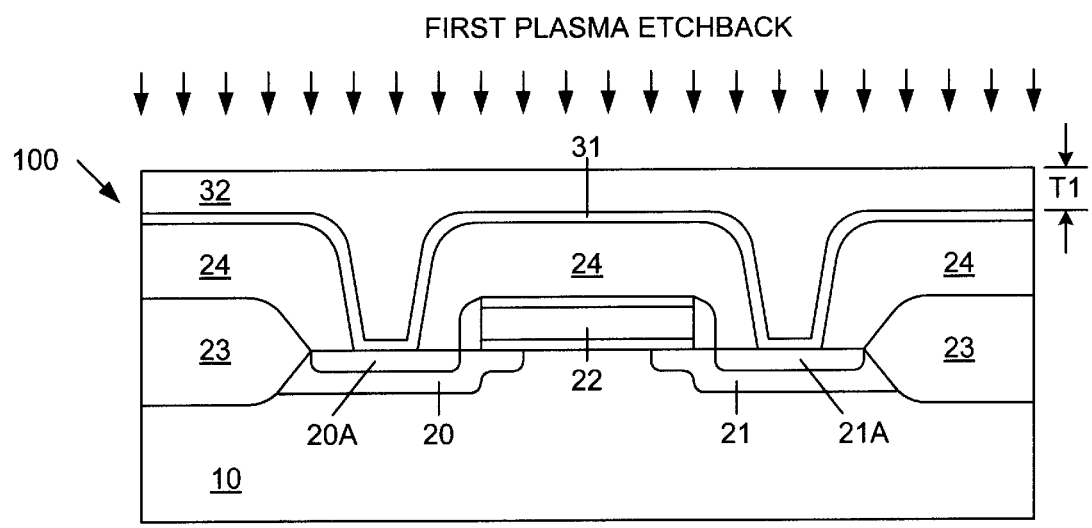
FIG. 3 is a cross sectional diagram of a semiconductor structure after a first plasma etchback step in accordance with one embodiment of the present invention.

FIG. 3 is a cross sectional diagram of semiconductor structure 100 at the end of the first plasma etchback. The first plasma etchback step is performed for a predetermined time, which is selected to ensure that tungsten layer 32 exists as a continuous layer over adhesion layer 31 at the end of the first plasma etchback step. In one embodiment, the predetermined duration of the first etchback step is about 30 seconds.

At the end of the first plasma etchback step, none of adhesion layer 31 is exposed through tungsten layer 32. In the described embodiment, the first etchback step is controlled such that tungsten layer 32 has a thickness T1 of about 260 nm over adhesion layer 31 at the end of the first etchback step. The first etchback step is a relatively high-power etch which removes a relatively large amount of tungsten layer 32 (about 400 nm) in a short amount of time. This advantageously increases the throughput of the process.

RF power supply 213 can be turned off at the end of the first plasma etch etchback step. Alternatively, RF power supply 213 can be adjusted to provide a low power output (i.e., 3 to 8 percent of full power). In either case, plasma 220 either does not exist or barely exists at this time, and there is no significant etching of tungsten layer 32. In the described embodiment, this first cooling step is performed by reducing the RF power supply 213 to provide a 50 W output for about 30 seconds. At this time, gas supply system 215 is controlled to provide 140 sccm $SF_6$ and 70 sccm Ar.

Semiconductor structure 100 begins to cool in the absence of a high power output from RF power supply 213. In the described embodiment, the cooling of semiconductor structure 100 is assisted by helium cooling system 214. In other embodiments, the cooling of semiconductor structure 100 is not assisted by an active cooling system. However, in such embodiments, it will take longer to cool semiconductor structure 100 to the desired temperature In the described embodiment, semiconductor structure 100 is cooled to a temperature in the range of about 25 to 35° C. In a particular embodiment, semiconductor structure 100 is cooled to a temperature in the range of 25 to 30° C. In yet another embodiment, semiconductor structure 100 is cooled to a temperature at least as low as 25° C.

As described in more detail below, as the temperature of semiconductor structure 100 is reduced, the etch rate of TiN adhesion layer 31 is also reduced. However, as the temperature is reduced, more polymers will be deposited on the walls of chamber 201, thereby necessitating more frequent chamber cleaning. The lower end of the cooled temperature range (i.e., 25° C.) is therefore selected as a compromise between these two competing factors.

After semiconductor structure 100 has been cooled to the selected temperature, the output power of RF power supply 213 is increased to about 350 W, and gas supply system 215 provides 200 sccm $SF_6$ and 70 sccm Ar to chamber 201. As a result, plasma 220 is generated for a second plasma etchback step. Note that the second plasma etchback step is performed at a lower power than the first plasma etchback step, in order to minimize the temperature rise during the second plasma etchback step.

Figure 4:
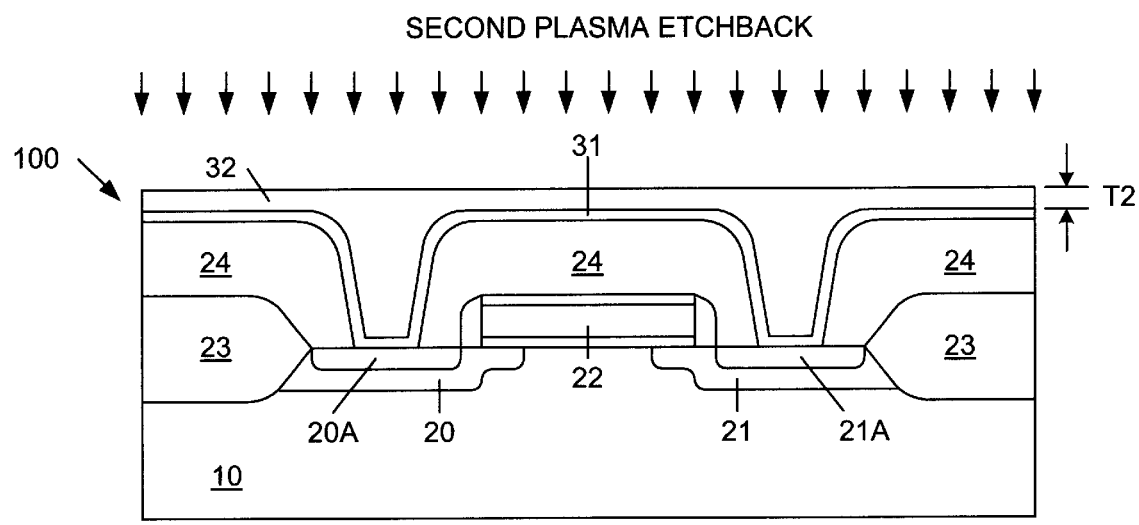
FIG. 4 is a cross sectional diagram of a semiconductor structure after a second plasma etchback step in accordance with one embodiment of the present invention.

FIG. 4 is a cross sectional diagram of semiconductor structure 100 at the end of the second plasma etchback. The second plasma etchback step is performed for a second predetermined time period, which is selected to ensure that tungsten layer 32 exists as a continuous layer over adhesion layer 31 at the end of the second plasma etchback step. In the described embodiment, the duration of the second etchback step is about 25 seconds.

At the end of the second plasma etchback step, none of adhesion layer 31 is exposed through tungsten layer 32. In the described embodiment, the second etchback step is controlled such that tungsten layer 32 has a thickness T2 of about 100 nm over adhesion layer 31 at the end of the second etchback step. In one embodiment, tungsten layer 32 has a thickness in the range of 80 to 200 nm at the end of the second etchback step.

RF power supply 213 is turned off or adjusted to provide a low power output at the end of the second plasma etchback step. In either case, plasma 220 either does not exist or barely exists at this time, and there is no significant etching of tungsten layer 2. In the described embodiment, this second cooling step is performed by controlling the RF power supply 213 to provide a reduced power output of about 50 W for about 45 seconds. At this time, gas supply system 215 is controlled to provide 140 sccm $SF_6$ and 70 sccm Ar.

Semiconductor structure 100 again begins to cool in the absence of a high power output from RF power supply 213. In the described embodiment, semiconductor structure 100 is again cooled to a temperature in the range of about 25 to 35° C. In a particular embodiment, semiconductor structure 100 is cooled to a temperature in the range of 25 to 30° C. In yet another embodiment semiconductor structure 100 is cooled to a temperature at least as low as 25° C.

After semiconductor structure 100 has been cooled to the selected temperature, the output power of RF power supply 213 is increased to about 250 W and gas supply system 215 provides 140 sccm $SF_6$ and 70 sccm Ar. As a result, plasma 220 is generated for a third plasma etchback step. Note that the third plasma etchback step is performed at a lower power than the first and second plasma etchback steps, in order to minimize the temperature rise during the third plasma etchback step. The endpoint of the third plasma etchback step is controlled by optical emission system 216. optical emission system 216 detects certain species in plasma 220 at a specific wavelength. In the present embodiment, optical emission system 216 will detect a relatively stable concentration of Fluorine (F) radicals at 704 nm while tungsten layer 32 is being etched. After tungsten layer 32 has been removed, the exposed portions of TiN adhesion layer 31 will start to be etched. At this time, there will be a relatively high concentration of F radicals. Endpoint detector software analyzes an emission signal provided by optical emission system 216. Upon detecting a relatively high concentration of F radicals, optical emission system 216 instructs RF power system 213 to reduce the RF power, thereby stopping the third plasma etch. In the described embodiment, the duration of the third plasma etchback will be about 45 seconds.

TiN adhesion layer 31 advantageously exhibits a low etch rate because of the relatively low temperature of semiconductor structure 100 during the third plasma etch. As a result, the third plasma etch does not etch through TiN adhesion layer 31. It is relatively easy to stop the third plasma etch on TiN adhesion layer 31 because the lowered temperature of semiconductor structure 100 significantly reduces the rate at which TiN adhesion layer 31 is etched by plasma 220. The low etch rate of adhesion layer 31 means that it will take a relatively long time for plasma 220 to etch through adhesion layer 31. Thus, there is a wider range of acceptable etch periods for the third plasma etchback. It therefore becomes relatively easy to avoid punching through adhesion layer 31 during the third plasma etchback step. It has been determined that starting at a temperature of about 25° C., a 10° C. increase in the temperature of semiconductor substrate 100 doubles the etch rate of the TiN adhesion layer.

Figure 5:
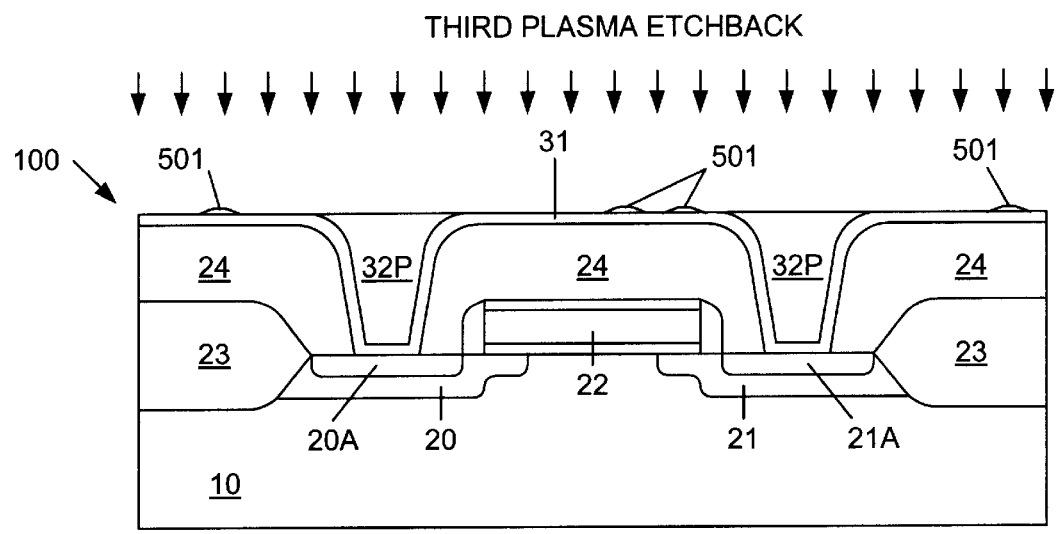
FIG. 5 is a cross sectional diagram of a semiconductor structure after a third plasma etchback step in accordance with one embodiment of the present invention.
Figure 6:
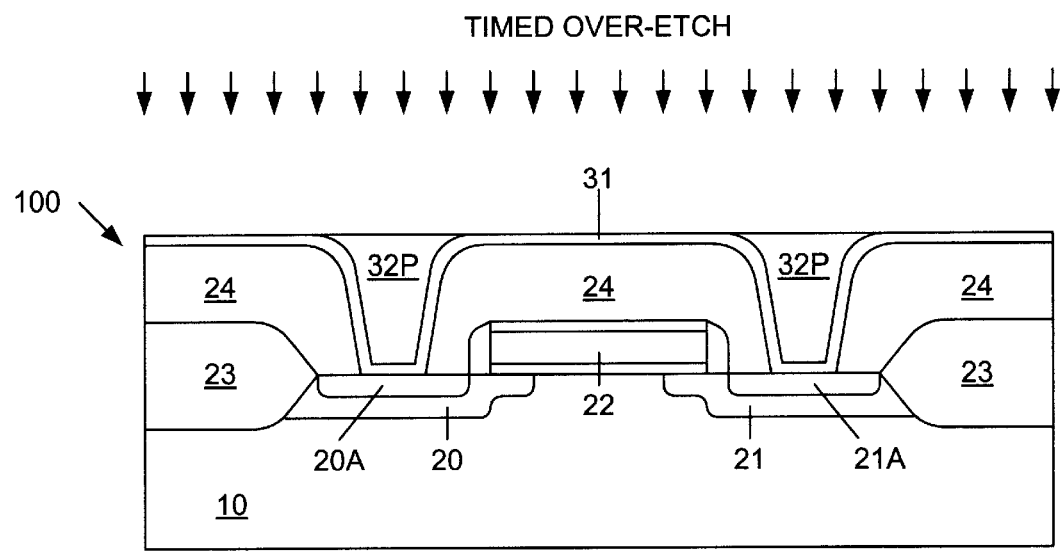
FIG. 6 is a cross sectional diagram of a semiconductor structure after a timed over-etch step in accordance with one embodiment of the present invention.

FIG. 5 is a cross sectional diagram of semiconductor structure 100 at the end of the third plasma etchback. Note that residual tungsten 501 may exist on the upper surface of TiN adhesion layer 31 at the end of the third plasma etchback. Thus, after the third plasma etch has been stopped, a timed over-etch step is performed to remove any residual tungsten. In one embodiment, this timed over-etch is performed at a power of 150 W for a duration of about 8 seconds in 100 sccm $SF_6$ and 70 sccm Ar. The timed over-etch step does not etch through the TiN adhesion layer 31. At the end of the timed over-etch step, tungsten layer 32 is completely removed over adhesion layer 31 (except at locations where tungsten plugs 32P are to be formed). FIG. 6 is a cross sectional diagram of semiconductor structure 100 at the end of the timed over-etch step.

Figure 7:
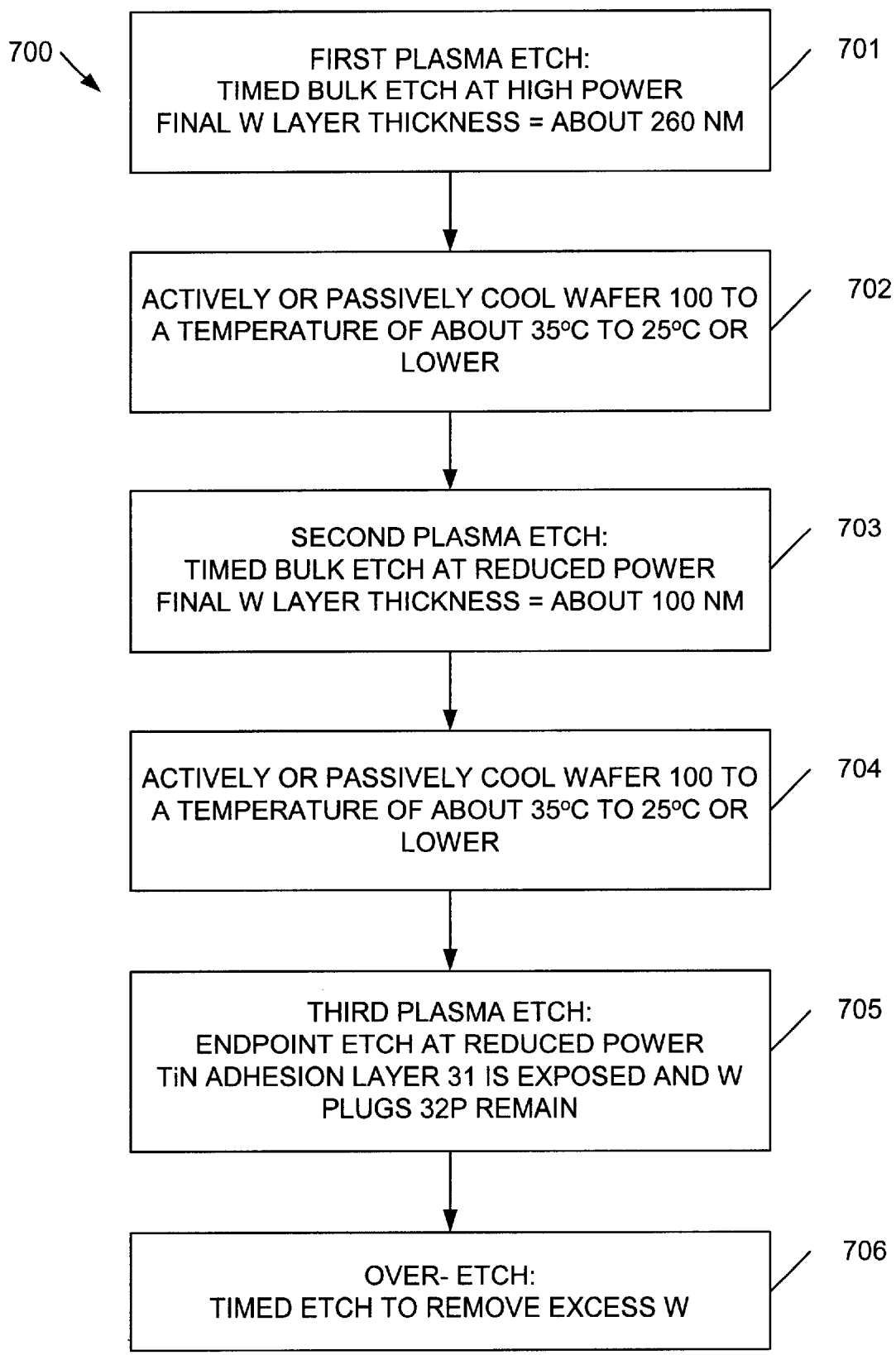
FIG. 7 is a process flow diagram of processing steps performed in accordance with one embodiment of the present invention.

FIG. 7 is a process flow diagram 700 illustrating the various process steps described above. Process flow 700 includes first plasma etchback 701, first cooling step 702, second plasma etchback 703, second cooling step 704, third plasma etchback 705, and timed over-etch step 706 performed in accordance with one embodiment of the present invention.

Although the present invention has been described as having two timed etches 701 and 703, two cooling steps 702 and 704, one endpoint etch 705 and one over-etch step 706, it is understood that other combinations are possible. For example, another embodiment may include a single timed etch followed by a cooling step and an endpoint etch. Similarly, another embodiment may include one timed etch followed by a cooling step and another timed etch. The over-etch step 706 may not be needed in some embodiments. Yet other embodiments may include more than two cooling steps and more than three plasma etchback steps.

After the timed over-etch step has been completed, a chemical mechanical polishing (CMP) step can be performed to remove the exposed portions of adhesion layer 31. Processing then proceeds with the formation of a conventional conductive layer (e.g., a metal-1 layer).

Alternatively, after the timed over-etch step has been completed, another plasma etch can be performed to remove the exposed portions of adhesion layer 31. In one embodiment, this third plasma etch is performed in the presence of chlorine and trifluoromethane and an RF power of about 500 W. This third plasma etch advantageously has a high selectivity with respect to the underlying dielectric layer 24. As a result, after the exposed portions of adhesion layer 31 are removed, the underlying dielectric layer 24 is not etched at a significant rate.

Alternatively, after the second plasma etchback step has been completed, portions of adhesion layer 31 remain exposed at the upper surface of semiconductor structure 100. The first layer of conductive material (e.g., aluminum) is then deposited over the upper surface of semiconductor structure 100. The first conductive layer is then patterned and etched, with adhesion layer 31 being etched at the same time.

Although the present invention has been described in connection with several embodiments, it is understood that this invention is not limited to the embodiments disclosed, but is capable of various modifications which would be apparent to one of ordinary skill in the art. For example, although the invention has been described in connection with the removal of a tungsten layer, it is understood that other types of layers may also benefit from the removal process described herein. In addition, although the various layers have been described as having particular thicknesses, it is understood that the thicknesses of the individual layers can be independently varied and tailored to meet the requirements of the resulting semiconductor devices. Thus, the invention is limited only by the following claims.

What is claimed is:

1. A method of etching back a tungsten layer that covers an underlying adhesion layer, the method comprising the steps of:

performing a first plasma etchback to remove a first thickness of the tungsten layer;

stopping the first plasma etchback, such that the adhesion layer remains completely covered by the tungsten layer at the end of the first plasma etchback;

cooling the adhesion layer at the end of the first plasma etchback; and then performing a second plasma etchback after cooling the adhesion layer; and stopping the second plasma etchback, such that selected portions of the adhesion layer are exposed, but not etched through, at the end of the second plasma etchback.

2. The method of claim 1, wherein the step of cooling the adhesion layer is performed until the adhesion layer reaches a temperature of about 25° C. or less.

3. The method of claim 1, wherein the first plasma etchback is performed for a first time period.

4. The method of claim 1, wherein the tungsten layer has a thickness in the range of 100 to 300 nm at the end of the first plasma etchback.

5. The method of claim 1, wherein the second plasma etchback is stopped in response to a signal generated by an optical emission system.

6. The method of claim 1, wherein the second plasma etchback is performed for a second time period.

7. The method of claim 1, wherein the adhesion layer has a thickness in the range of 20 to 50 nm.

8. The method of claim 1, wherein the adhesion layer comprises titanium nitride (TiN).

9. The method of claim 1, further comprising the step of performing an over-etch after the second plasma etchback.

10. The method of claim 1, wherein the step of cooling the adhesion layer further comprises using an active cooling system.

11. The method of claim 10, wherein the active cooling system comprises a helium cooling system.

12. The method of claim 1, wherein the step of cooling the adhesion layer is performed until the adhesion layer reaches a temperature less than 35° C.

13. The method of claim 12, wherein the step of cooling the adhesion layer is performed until the adhesion layer reaches a temperature in the range of 25° C. to 35° C.

14. The method of claim 12, wherein the step of cooling the adhesion layer is performed until the adhesion layer reaches a temperature in the range of 25° C. to 30° C.

15. The method of claim 1, wherein the first plasma etchback comprises the step of applying radio frequency (RF) power to a gas mixture, thereby creating a gas plasma which etches the tungsten layer.

16. The method of claim 15, wherein the step of cooling the adhesion layer comprises turning off the RF power.

17. The method of claim 15, wherein the step of cooling the adhesion layer comprises reducing the RF power.

18. The method of claim 15, wherein the step of cooling the adhesion layer comprises reducing the RF power to a level that is about 3 to 8 percent of the RF power during the first plasma etchback.

19. A method of etching back a tungsten layer that covers an underlying adhesion layer, the method comprising the steps of:

performing a first plasma etchback at a first power for a first time period, thereby removing a first thickness of the tungsten layer, wherein the adhesion layer remains completely covered by the tungsten layer at the end of the first plasma etchback;

cooling the adhesion layer at the end of the first plasma etchback; and then performing a second plasma etchback at a second power for a second time period, thereby removing a second thickness of the tungsten layer, wherein the adhesion layer remains completely covered by the tungsten layer at the end of the second plasma etchback;

cooling the adhesion layer at the end of the second plasma etchback; and then performing a third plasma etchback at a third power until an endpoint is detected, thereby exposing, but not etching through, selected portions of the adhesion layer at the end of the third plasma etchback.

20. The method of claim 19, wherein the first power is greater than the second power, and the second power is greater than the third power.

21. The method of claim 19, wherein the first thickness is greater than the second thickness.

* * * * *